United States Patent

Min et al.

[11] Patent Number: 5,834,163
[45] Date of Patent: Nov. 10, 1998

[54] METHOD FOR FORMING AN ELECTRICAL CONNECTION IN A THIN FILM ACTUATED MIRROR

[75] Inventors: Yong-Ki Min; Min-Sik Um, both of Seoul, Rep. of Korea

[73] Assignee: Daewoo Electronics Co., Ltd., Seoul, Rep. of Korea

[21] Appl. No.: 699,755

[22] Filed: Aug. 20, 1996

[30] Foreign Application Priority Data

Aug. 22, 1995 [KR] Rep. of Korea ........................ 95-25840
Aug. 22, 1995 [KR] Rep. of Korea ........................ 95-25841
Dec. 19, 1995 [KR] Rep. of Korea ........................ 95-52081
Dec. 19, 1995 [KR] Rep. of Korea ........................ 95-52082

[51] Int. Cl.$^6$ .............................. G03C 5/00; G02B 21/26
[52] U.S. Cl. .................... 430/321; 430/311; 359/291; 359/295
[58] Field of Search .................... 430/311, 321; 359/850, 900, 291, 295

[56] References Cited

U.S. PATENT DOCUMENTS 4,941,033  7/1990  Kishida .................................. 357/75
5,608,569  3/1997  Kim ...................................... 359/291

FOREIGN PATENT DOCUMENTS 0652455  5/1995  European Pat. Off. .

Primary Examiner—Janet C. Baxter
Assistant Examiner—Rosemary Ashton
Attorney, Agent, or Firm—Anderson, Kill & Olick, P.C.

[57] ABSTRACT

A method for electrically connecting a thin film electrode to a connecting terminal on an active matrix in the manufacture of a thin film actuated mirror is disclosed. The method includes the steps of: forming a thin film sacrificial layer having an empty cavity on top of the active matrix; forming an elastic, a second thin film and a thin film electrodisplacive layers, successively, on top of the thin film sacrificial layer including the empty cavity; forming a contact hole extending from top of the thin film electrodisplacive layer to top of the connecting terminal; forming a first thin film layer on top of the thin film electrodisplacive layer including the contact hole; patterning the first thin film, the thin film electrodisplacive, the second thin film and the elastic layers, respectively; and removing the thin film sacrificial layer, thereby forming the thin film actuated mirror.

4 Claims, 8 Drawing Sheets

METHOD FOR FORMING AN ELECTRICAL CONNECTION IN A THIN FILM ACTUATED MIRROR

FIELD OF THE INVENTION

The present invention relates to an array of M×N thin film actuated mirrors; arid, more particularly, to an improved method for establishing an electrical connection between a thin film electrode and a connecting terminal in each of the thin film actuated mirrors.

BACKGROUND OF THE INVENTION

Among the various video display systems available in the art, an optical projection system is known to be capable of providing high quality displays in a large scale. In such an optical projection system, light from a lamp is uniformly illuminated onto an array of, e.g., M×N, actuated mirrors, wherein each of the mirrors is coupled with each of the actuators. The actuators may be made of an electrodisplacive material such as a piezoelectric or an electrostrictive material which deforms in response to an electric field applied thereto.

The reflected light beam from each of the mirrors is incident upon an aperture of, e.g., an optical baffle. By applying an electrical signal to each of the actuators, the relative position of each of the mirrors to the incident light beam is altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

In FIG. 1, there is illustrated an array 100 of M×N thin film actuated mirrors 101, wherein M and N are integers, disclosed in a copending commonly owned application, U.S. Ser. No. 08/581,015, now U.S. Pat. No. 5,636,051 entitled "THIN FILM ACTUATED MIRROR ARRAY HAVING DIELECTRIC LAYERS", the array 100 including an active matrix 10, an array of M×N conduits 25, an array of M×N actuating structures 90 and M×N number of multilayer stacks of thin film dielectric members 75.

The active matrix 10 includes a substrate 12, an array of M×N connecting terminals 14 and array of M×N transistors (not shown), wherein each of the connecting terminals 14 is electrically connected to a corresponding transistor.

Each of the actuating structures 90 includes an elastic member 35, a second thin film electrode 45, a thin film electrodisplacive member 55 and a first thin film electrode 65. The first and the second thin film electrodes 65, 45 are, respectively, located on top and bottom of the thin film electrodisplacive member 55. The elastic member 35 is positioned on bottom of the second thin film electrode 45. The first thin film electrode 65 made of an electrically conducting and light reflecting material is electrically connected to ground, allowing it to function as a mirror as well as a common bias electrode in each of the actuating structures 90. The second thin film electrode 45 made of an electrically conducting material is electrically connected to a corresponding connecting terminal 14, allowing it to function as a signal electrode in each of the actuating structures 90.

Each of the multilayer stacks of thin film dielectric members 75 for ensuring an optimum optical efficiency of each of the thin film actuated mirrors 101 is placed on top of each of the actuating structures 90, wherein each of the thin film dielectric members 75 has a predetermined thickness and a specific refractive index.

Each of the conduits 25 functions as a means for electrically connecting the second thin film electrode 45 to the corresponding connecting terminal 14. Each of the conduits 25 is formed by: first creating an array of M×N holes (not shown), each of the holes extending from top of the elastic member 35 to top of the connecting terminal 14 by using an etching method; and filling therein with the metal by using a sputtering method. The second thin film electrode 45 is then formed directly on top of each conduit 25, thereby electrically connecting the second thin film electrode 45 to the corresponding connecting terminal 14. There are a number of problems associated with the conduits 25 shown in FIG. 1. In addition to being different to form, the conduits 25 may also get damaged during a heat treatment of the thin film electrodisplacive member 55 to allow a phase transition to take place, followed by a rapid cooling of the thin film electrodisplacive member 55 to be formed on top of the second thin film electrode 45.

There is illustrated in FIG. 2 another method for establishing an electrical connection between the second thin film electrode 45 to the corresponding connecting terminal 14, the method involving a formation of a contact hole 80 in place of the conduit 25 in the elastic member 35, followed by a formation of the second thin film electrode 45.

There are also a number of problems associated with the contact hole 80 shown in FIG. 2, however, one of them being the formation of cracks. The heat treatment followed by the rapid cooling of the thin film electrodisplacive member 55, however, results in the formation of cracks at a portion of the thin film electrodisplacive member 55 deposited in the contact hole 80. The cracks may lead to an establishment of an electrical connection between the first thin film electrode 65 which is subsequently formed on top of the thin film electrodisplacive member 55 and the second thin film electrode 45, resulting in a short-circuit therebetween. Since the first thin film electrode 65 in each of the actuating structures 90 is interconnected with other first thin film electrodes (not shown) in the same row or column in the array 100, if one of the actuating structures 90 becomes inoperable due the above reason, i.e., short-circuit, all of the other actuating structures 90 in the same row or column in the array 100 become inoperable.

SUMMARY OF THE INVENTION

It is, therefore, a primary object of the present invention to provide an improved method for establishing an electrical connection between a thin film electrode and a connecting terminal in the manufacture of a thin film actuated mirror, the method being capable of minimizing the effect of a heat treatment involved in the manufacture of the thin film actuated mirror.

In accordance with one aspect of the present invention, there is provided a method for electrically connecting a thin film electrode to a connecting terminal on an active matrix in the manufacture of a thin film actuated mirror, the method comprising the steps of: forming a thin film sacrificial layer having an empty cavity on top of the active matrix; forming an elastic, a second thin film and a thin film electrodisplacive layers, successively, on top of the thin film sacrificial layer including the empty cavity; forming a contact hole extending from top of the thin film electrodisplacive layer to top of the connecting terminal, wherein the contact hole has inner surfaces; forming a first thin film layer on top of the thin film electrodisplacive layer including the inner surfaces of the contact hole; patterning the first thin film, the thin film electrodisplacive, the second thin film and the elastic layers, respectively; and removing the thin film sacrificial layer, thereby forming the thin film actuated mirror.

BRIEF DESCRIPTION OF THE DRAWINGS

The above and other objects and features of the present invention will become apparent from the following description of the preferred embodiments, when given in conjunction with the accompanying drawings, wherein.

DETAILED DESCRIPTION OF THE PREFERRED EMBODIMENTS

Figure 1:
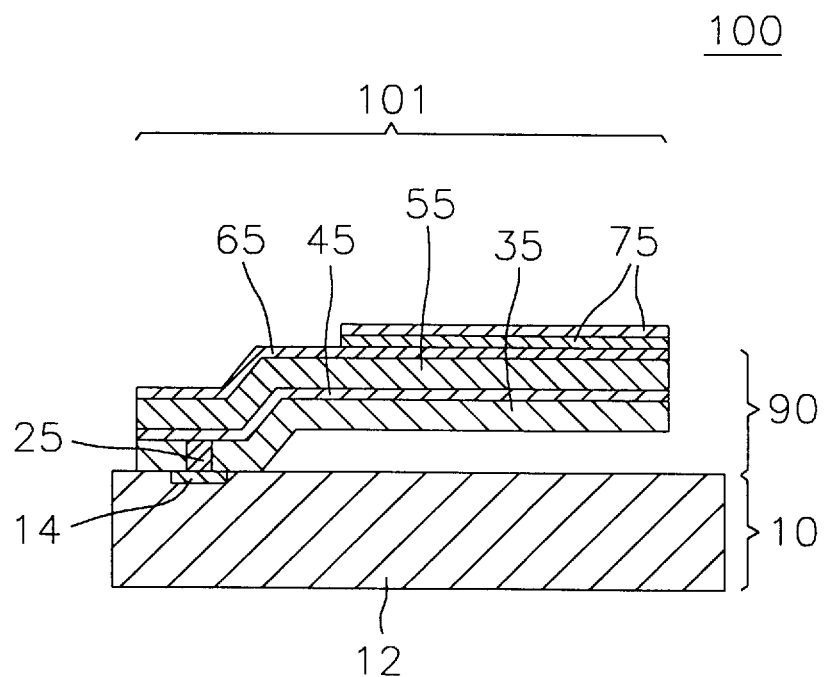
FIG. 1 shows a cross sectional view of an array of M×N thin film actuated mirrors previously disclosed.
Figure 2:
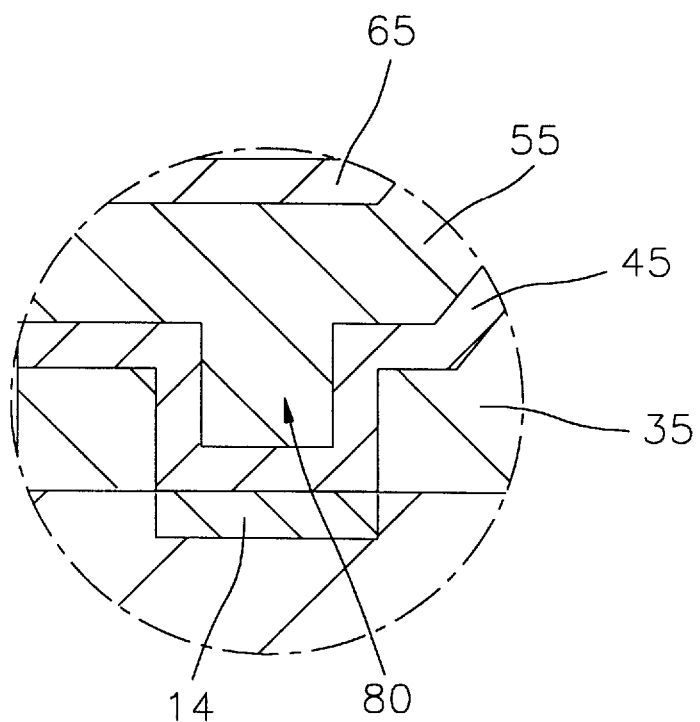
FIG. 2 presents a detailed view of a prior art contact hole in the thin film actuated mirror.

There are provided in FIGS. 3A to 3E, 4A to 4E and 5A to 5E schematic cross sectional views setting forth a method for the manufacture of an array 300 of M×N thin film actuated mirrors 301, wherein M and N are integers, in accordance with the present invention, respectively. It should be noted that like parts appearing in FIGS. 3A to 3E, 4A to 4E and 5A to 5E are represented by like reference numerals.

The process for the manufacture of the array 300 begins with the preparation of an active matrix 210 including a substrate 212, an array of M×N connecting terminals 214 formed on top of the substrate 212 and an array of M×N transistors (not shown), wherein each of the connecting terminals 214 is electrically connected to a corresponding transistor in the array of transistors.

In a subsequent step, there is formed on top of the active matrix 210 a thin film sacrificial layer 220, having a thickness of 0.1–2 μm, and made of a metal, e.g., copper (Cu) or nickel (Ni), a phosphor-silicate glass (PSG) or a poly-Si. The thin film sacrificial layer 220 is formed by using a sputtering or an evaporation method if the thin film sacrificial layer 220 is made of a metal, a chemical vapor deposition (CVD) method or a spin coating method if the thin film sacrificial layer 220 is made of a PSG, or a CVD method if the thin film sacrificial layer 220 is made of a poly-Si.

Thereafter, there is formed an array of M×N pairs of empty cavities (not shown) on the thin film sacrificial layer 220 by using an wet or a dry etching method. One of the empty cavities in each pair encompasses one of the connecting terminals 214.

Subsequently, an elastic layer 230, made of an insulating material, e.g., silicon nitride, and having a thickness of 0.1–2 μm, is deposited on top of the thin film sacrificial layer 220 including the empty cavities by using a CVD method.

Figure 3A:
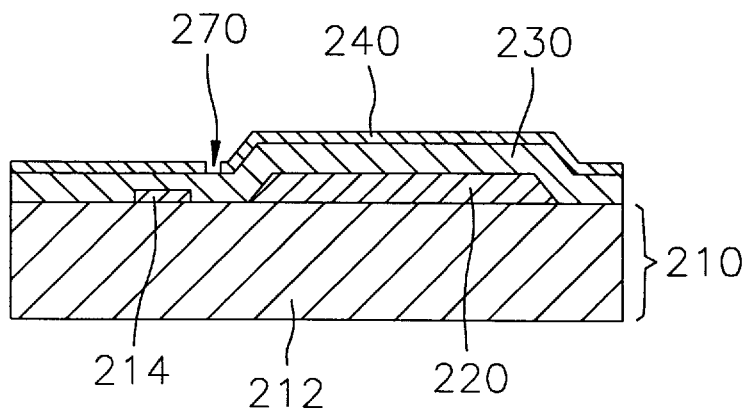
FIGS. 3A to 3E provide schematic cross sectional views setting forth a method for the manufacture of an array of M×N thin film actuated mirrors in accordance with first embodiment of the present invention.

Then, a second thin film layer 240, made of an electrically conducting material, e.g., aluminum (Al), and having a thickness of 0.1–2 μm, is formed on top of the elastic layer 230 by using a sputtering or a vacuum evaporation method. There are then formed regularly spaced isolating means 270 on the second thin film layer 240 by using a photolithography or a laser trimming method, as shown in FIG. 3A. Each of the isolating means 270 can be a horizontal stripe shown in FIG. 3A or a circular surrounding a region where a contact hole is to be formed. Each of the isolating means 270 physically divides a second thin film electrode in each of the thin film actuated mirrors 301 into two parts, one of the parts being connected to ground, to thereby prevent a first thin film electrode for receiving an electrical signal through the corresponding connecting terminal 214 therein from coming into an electrical contact with the part of the second thin film electrode connected to ground. In other words, each of the isolating means 270 is used to electrically isolate the first thin film electrode from the part of the second thin film electrode in each of the thin film actuated mirrors 301.

Figure 3B:
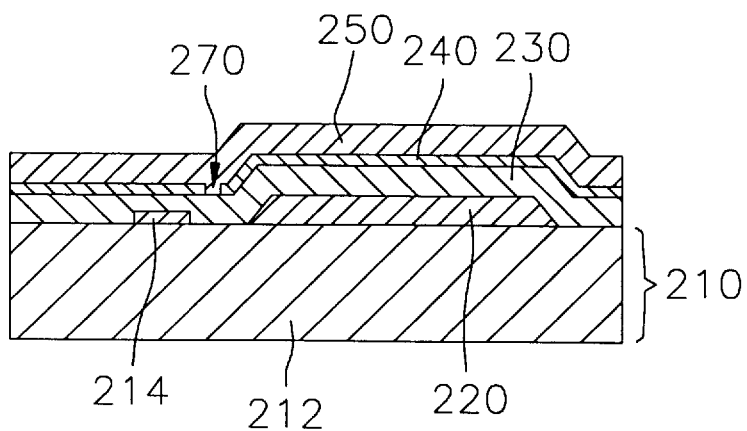

Next, a thin film electrodisplacive layer 250, made of a piezoelectric material, e.g., lead zirconium titanate (PZT), or an electrostrictive material, e.g., lead magnesium niobate (PMN), and having a thickness of 0.1–2 μm, is formed on top of the second thin film layer 240 by using a CVD method, an evaporation method, a Sol-Gel method or a sputtering method, as shown in FIG. 3B. The thin film electrodisplacive layer 250 is then heat treated to allow a phase transition to take place.

Figure 3C:
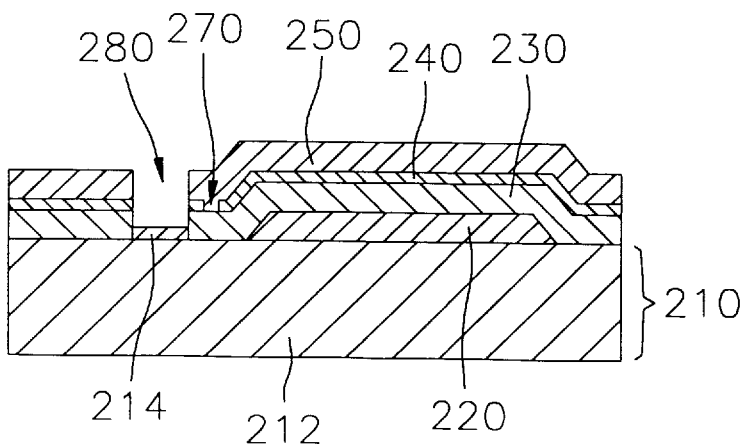

Thereafter, there is created an array of M×N contact holes 280 by using a photolithography method, as shown in FIG. 3C. Each of the contact holes 280 extend from top of the thin film electrodisplacive layer 250 to top of the corresponding connecting terminal 214, and has inner surfaces (not shown).

Figure 3D:
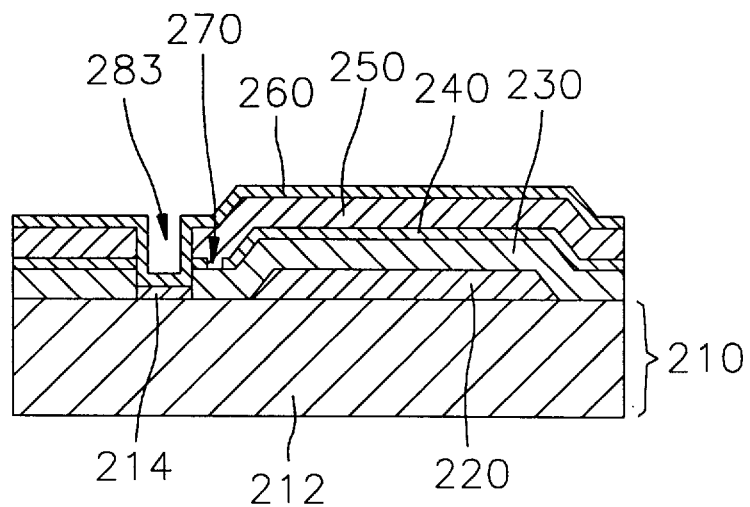

In an ensuing step, a first thin film layer 260, made of an electrically conducting and light reflecting material, e.g., aluminum (Al) or silver (Ag), and having a thickness of 0.1–2 μm, is formed on top of the thin film electrodisplacive layer 250 including the inner surfaces of the contact holes 280 by using a sputtering, a CVD or a vacuum evaporation method, resulting in an array of recessed portions 283 whose inner surfaces are covered with the first thin film layer 260, as shown in FIG. 3D.

After the above step, the first thin film 260, the thin film electrodisplacive 250, the second thin film 240 and the elastic layers 230 are, respectively, patterned by using a photolithography or a laser trimming method, thereby forming an array of M×N actuating structures 200, each of the actuating structures 200 including a first thin film electrode 265, a thin film electrodisplacive member 255, a second thin film electrode 245 and an elastic member 235. Each of the second thin film electrodes 245 is electrically connected to ground, thereby functioning as a common bias electrode in each of the actuating structures 200. Each of the first thin film electrodes 265 is electrically connected to a corresponding connecting terminal 214, thereby functioning as a mirror as well as a signal electrode in each of the actuating structures 200.

The preceding step is then followed by completely covering each of the actuating structures 200 with a thin film protection layer (not shown).

Figure 3E:
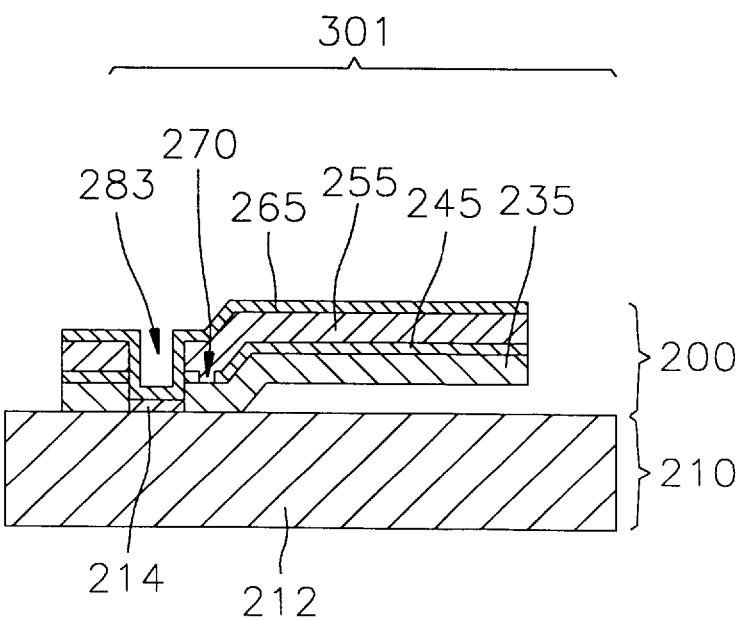

The thin film sacrificial layer 220 is then removed by using an etching method. Finally, the thin film protection layer is removed, thereby forming the array 300 of M×N thin film actuated mirrors 301, as shown in FIG. 3E.

Figure 4A:
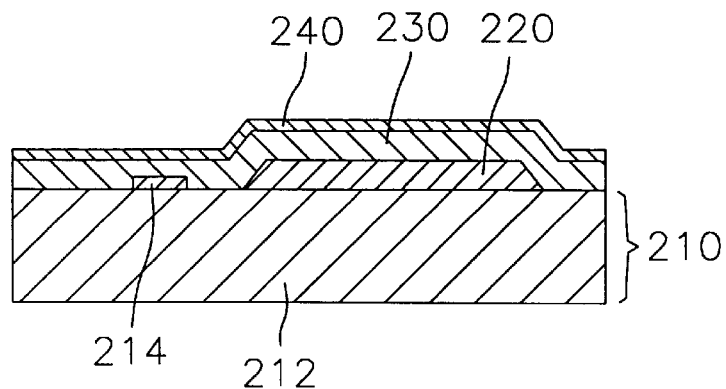
FIGS. 4A to 4E offer schematic cross sectional views setting forth a method for the manufacture of an array of M×N thin film actuated mirrors in accordance with second embodiment of the present invention.
Figure 4B:
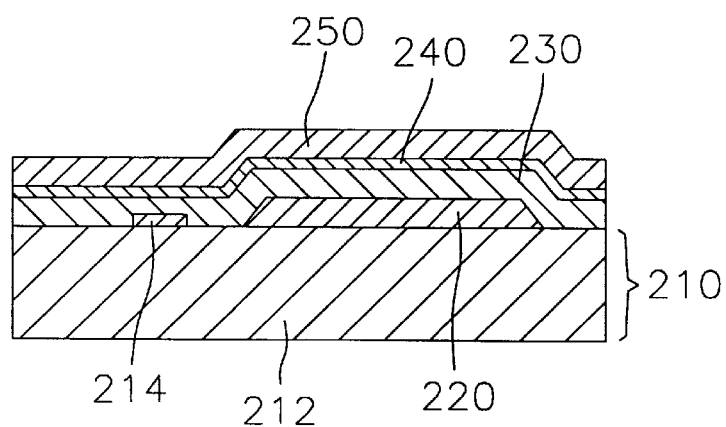
Figure 4C:
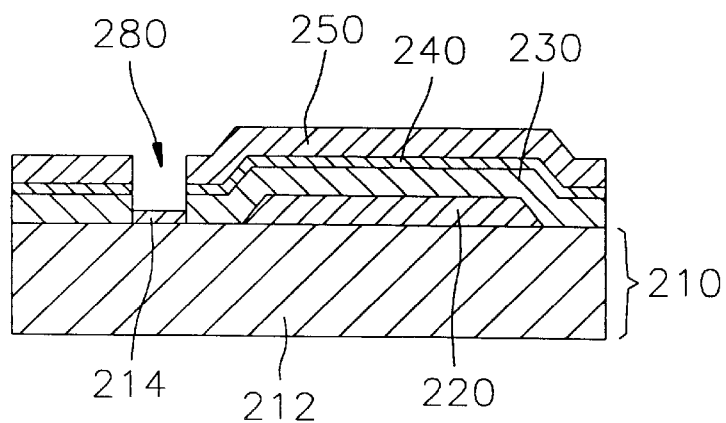
Figure 4D:
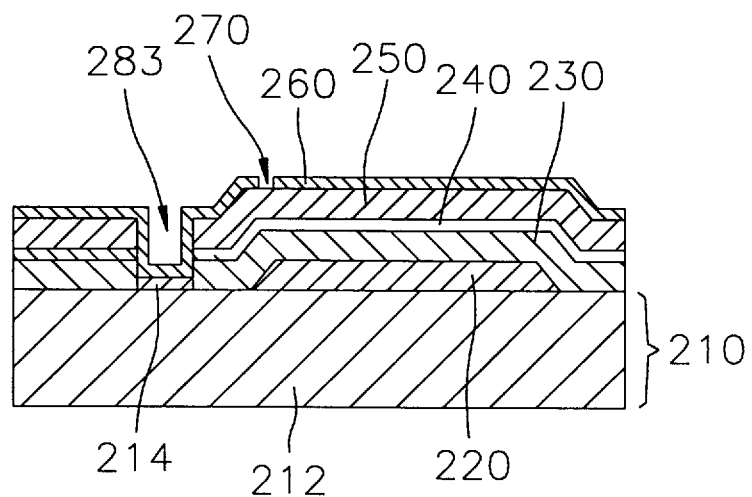
Figure 4E:
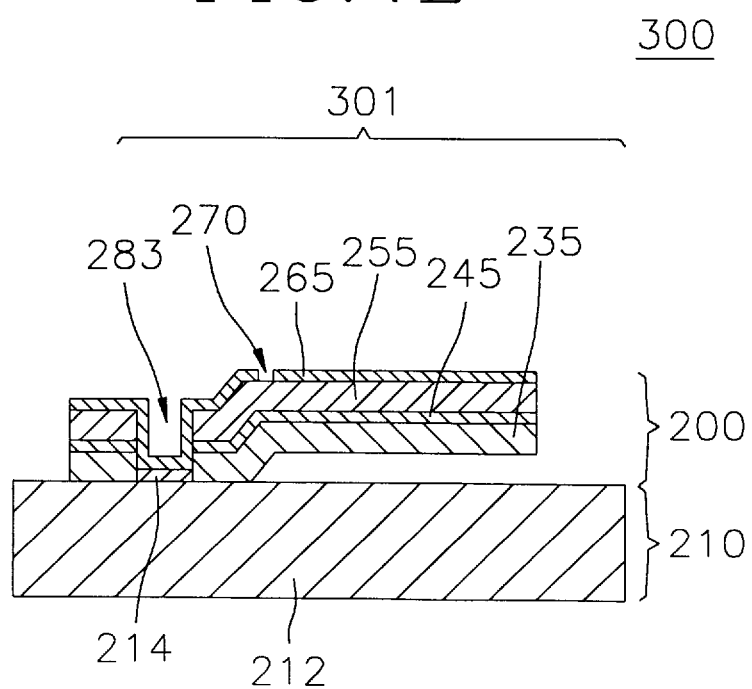

In FIGS. 4A to 4E, there are offered schematic cross sectional views setting forth a method for the manufacture of an array 300 of M×N thin film actuated mirrors 301 in accordance with second embodiment of the present invention, the second embodiment being identical to the first embodiment illustrated in FIGS. 3A to 3E, except that the isolating means 270 is formed on the first thin film layer 260 as shown in FIG. 4D, instead of being formed on the second thin film layer 240 as shown in FIG. 3A. That is, after the deposition of the first thin film layer 260, regularly spaced isolating means 270 are formed on the first thin film layer 260 using the same method as the formation of the isolating means 270 on the second thin film layer 240 in the first embodiment. In each of the thin film actuated mirrors 301 in the array 300 formed using the second embodiment, each of the second thin film electrodes 245 is electrically connected to a corresponding connecting terminal 214, thereby functioning as a signal electrode in each of the actuating structures 200, and each of the first thin film electrodes 265 is electrically connected to ground, thereby functioning as a mirror as well as a common bias electrode in each of the actuating structures 200.

In FIGS. 5A to 5E, there are presented schematic cross sectional views setting forth a method for the manufacture of an array 300 of M×N thin film actuated mirrors 301 in accordance with third embodiment of the present invention.

The process for the manufacture of the array 300 begins with the preparation of an active matrix 210 including a substrate 212, an array of M×N connecting terminals 214 formed on top of the substrate 212 and an array of M×N transistors (not shown).

Figure 5A:
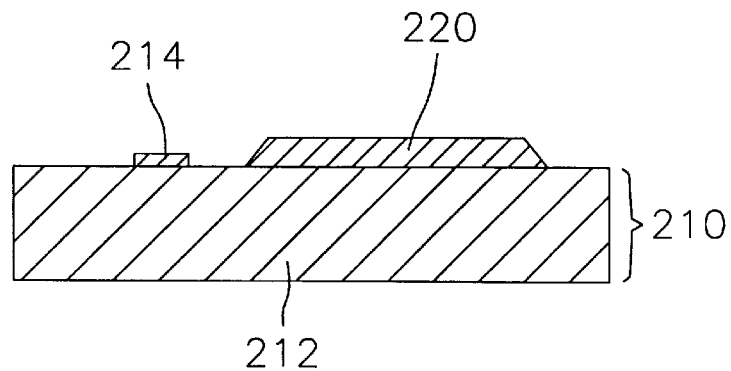
FIGS. 5A to 5E represent schematic cross sectional views setting forth a method for the manufacture of an array of M×N thin film actuated mirrors in accordance with third embodiment of the present invention.

In a subsequent step, there is formed on top of the active matrix 210 a thin film sacrificial layer 220 having an array of M×N pairs of empty cavities (not shown). One of the empty cavities in each pair encompasses one of the connecting terminals 214, as shown in FIG. 5A.

Figure 5B:
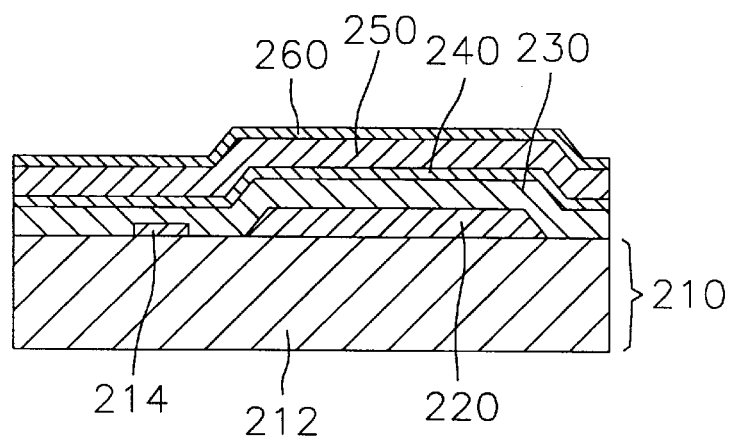

Subsequently, an elastic layer 230, a second thin film layer 240, a thin film electrodisplacive layer 250 and a first thin film layer 260 are, successively, formed on top of the thin film sacrificial layer 220 including the empty cavities, as shown in FIG. 5B.

Figure 5C:
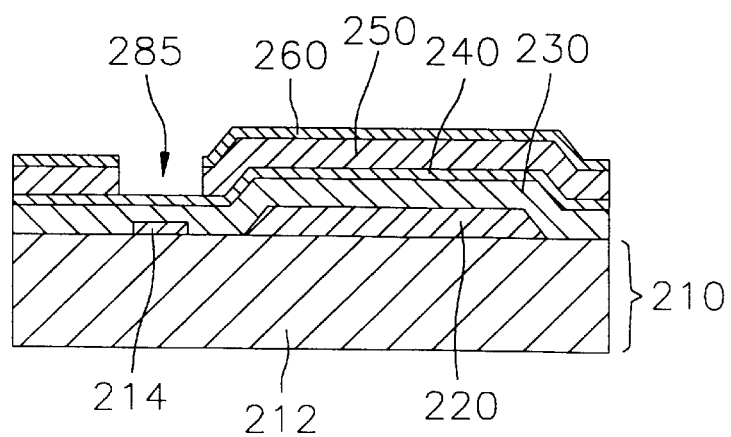

Then, there is created an array of M×N openings 285 on the first thin film layer 260 and the thin film electrodisplacive layer 250 by using a photolithography method, until the second thin film layer 240 is exposed, as shown in FIG. 5C. Each of the openings 285 is located on top of the connecting terminal 214 with the second thin film layer 240 and the elastic layer 230 intervening therebetween.

Thereafter, there is formed an array of M×N contact holes (not shown) by using a photolithography method. Each of the contact holes extends from top of the exposed second thin film layer 240 to top of the connecting terminal 214, wherein each of the contact holes has inner surfaces (not shown), and the width thereof is smaller than that of each of the openings 285.

Figure 5D:
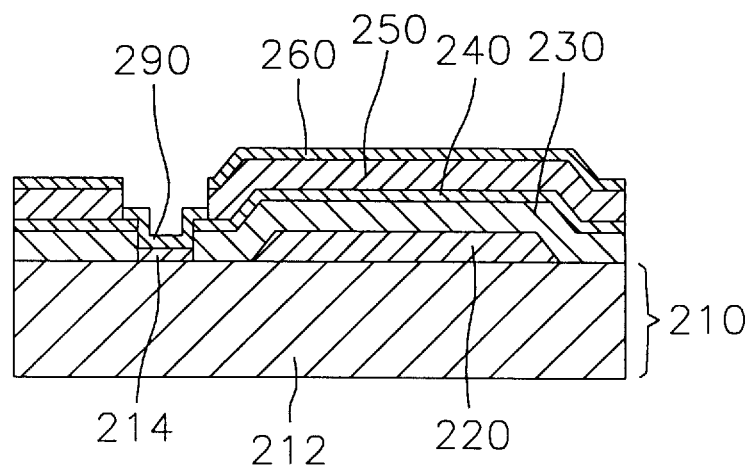

In an ensuing step, there is formed a contact member 290 in each of the contact holes in such a way that it connects electrically the second thin film layer 240 to the connecting terminal 214, by using a lift-off method, resulting in a structure shown in FIG. 5D.

After the above step, the first thin film 260, the thin film electrodisplacive 250, the second thin film 240 and the elastic layers 230 are, respectively, patterned, thereby forming an array of M×N actuating structures 200, each of the actuating structures 200 including a first thin film electrode 265, a thin film electrodisplacive member 255, a second thin film electrode 245 and an elastic member 235. Each of the second thin film electrodes 245 is electrically connected to a corresponding connecting terminal 214, thereby functioning as a signal electrode in each of the actuating structures 200. Each of the first thin film electrodes 265 is electrically connected to ground, thereby functioning as a mirror as well as a common bias electrode in each of the actuating structures 200.

The preceding step is then followed by completely covering each of the actuating structures 200 with a thin film protection layer (not shown).

Figure 5E:
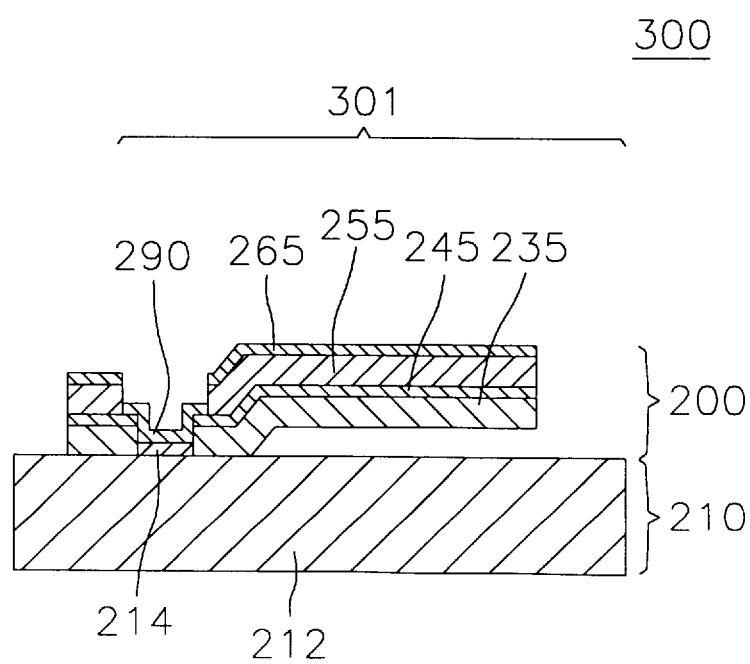

The thin film sacrificial layer 220 is then removed by using an etching method. Finally, the thin film protection layer is removed, thereby forming the array 300 of M×N thin film actuated mirrors 301, as shown in FIG. 5E.

In the above method for the manufacture of the array 300, the first thin film layer 260 can be formed after the formation of the contact member 290.

In the inventive methods for the manufacture of the array 300 of M×N thin film actuated mirrors 301, since the contact holes 280 are formed after the heat treatment of the thin film electrodisplacive layer 250, the cracks may not form on the thin film electrodisplacive layer 250, thereby preventing the thin film electrodes in each of the thin film actuated mirrors 301 from coming into an electrical contact with each other, which, in turn, prevents a short-circuit therebetween.

While the present invention has been described with respect to certain preferred embodiments only, other modifications and variations may be made without departing from the scope of the present invention as set forth in the following claims.

What is claimed is:

1. A method for electrically connecting a thin film electrode to a connecting terminal of an active matrix in the manufacture of a thin film actuated mirror, the method comprising the steps of:

forming a thin film sacrificial layer on top of the active matrix;

forming an elastic layer, a second thin film layer and a thin film electrodisplacive layer, successively, on top of the thin film sacrificial layer and the active matrix;

forming a contact hole extending from the top of the thin film electrodisplacive layer to top of the connecting terminal of the active matrix, wherein the contact hole has inner surfaces;

forming a first thin film layer on top of the thin film electrodisplacive layer including the inner surfaces of the contact hole to thereby electrically connect the first thin film layer to the connecting terminal of the active matrix;

patterning the first thin film layer, the thin film electrodisplacive layer, the second thin film layer and the elastic layer, respectively; and removing the thin film sacrificial layer, thereby forming the thin film actuated mirror.

2. The method of claim 1, wherein the contact hole is formed by using a photolithography method.

3. A method for electrically connecting a first thin film electrode to a connecting terminal of an active matrix in the manufacture of a thin film actuated mirror, the method comprising the steps of:

forming a thin film sacrificial layer on top of the active matrix;

forming an elastic layer and a second thin film layer, successively, on top of the thin film sacrificial layer and the active matrix;

forming regularly spaced isolating means on the second thin film layers;

forming a thin film electrodisplacive layer on top of the second thin film layer;

forming a contact hole extending from the top of the thin film electrodisplacive layer to top of the connecting terminal of the active matrix, wherein the contact hole has inner surfaces;

forming a first thin film layer on top of the thin film electrodisplacive layer including the inner surfaces of the contact hole;

patterning the first thin film layer, the thin film electrodisplacive layer, the second thin film layer and the elastic layers, respectively; and removing the thin film sacrificial layer, thereby forming the thin film actuated mirror.

4. A method for electrically connecting a first thin film electrode to a connecting terminal of an active matrix in the manufacture of a thin film actuated mirror, the method comprising the steps of:

forming a thin film sacrificial layer on top of the active matrix;

forming an elastic layer and a second thin film layer and a thin film electrodisplacive layer, successively, on top of the thin film sacrificial layer and the active matrix;

forming a contact hole extending from the top of the thin film electrodisplacive layer to top of the connecting terminal of the active matrix, wherein the contact hole has inner surfaces;

forming a first thin film layer on top of the thin film electrodisplacive layer including the inner surfaces of the contact hole;

forming regularly spaced isolating means on the first thin film layer;

patterning the first thin film layer, the thin film electrodisplacive layer, the second thin film layer and the elastic layers, respectively; and removing the thin film sacrificial layer, thereby forming the thin film actuated mirror.

* * * * *